United States Patent [19]
Anklam et al.

[11] Patent Number: 5,023,574
[45] Date of Patent: Jun. 11, 1991

[54] NONLINEAR TRANSMISSION LINES HAVING NONCOMMENSURATE VARACTOR CELLS

[75] Inventors: William J. Anklam, Santa Rosa; William E. Kunz, Foster City, both of Calif.

[73] Assignee: Hewlett-Packard Company, Palo Alto, Calif.

[21] Appl. No.: 512,297

[22] Filed: Apr. 17, 1990

[51] Int. Cl.$^5$ .............................................. H01P 5/00
[52] U.S. Cl. ...................................... 333/20; 307/320
[58] Field of Search ......................... 333/20, 23, 247; 307/320, 266; 328/58, 65

[56] References Cited

U.S. PATENT DOCUMENTS 4,855,696 8/1989 Tan et al. ............................. 333/20

Primary Examiner—Paul Gensler
Attorney, Agent, or Firm—William C. Milks, III

[57] ABSTRACT

Varactor diodes having noncommensurate parametric values are utilized within respective cells of a nonlinear transmission line. By the appropriate selection of varactor cell parameters, the configuration of a nonlinear transmission line can be improved to alleviate problems associated with varactor turn-on and punch-through voltage limitations, soliton compression and inefficient use of varactor nonlinearity, reflections from mismatched load and source impedances, and rining and soliton generation.

20 Claims, 16 Drawing Sheets

NONLINEAR TRANSMISSION LINES HAVING NONCOMMENSURATE VARACTOR CELLS

BACKGROUND OF THE INVENTION

This invention relates in general to pulse generators, and, more particularly, to nonlinear transmission lines utilized in pulse compressors that are capable of generating large-amplitude, narrow-width pulses. Generation of picosecond pulses is necessary for many applications, including applications involving characterization of very high speed transient phenomena or very high bandwidth sampling, mixing, or speed/delay-time measurement. In these applications, the generated pulses can be used as a trigger, an excitation signal, or a time base reference.

Picosecond pulses are presently generated by several different techniques. One technique employs a "nonlinear transmission line."

A nonlinear transmission line is an LC ladder network, as shown in FIG. 1, in which the capacitance of capacitors $C_k$ is dependent on the voltage across them and/or the inductance of inductors $L_k$ is dependent on the current through them. In some instances, actual implementations of nonlinear transmission lines have been constructed using varactor diodes as the voltage-variable capacitors and either discrete lumped-element inductors or lengths of transmission line as the inductors.

The pulse-shaping characteristic of such a nonlinear transmission line is a result of the voltage-dependent and/or current-dependent time delay $$T_k = \sqrt{L_k(I_k)C_k(V_k)} \quad (1)$$

where $V_k$ is the voltage across the $k^{th}$ varactor diode and $I_k$ is the current through the $k^{th}$ inductor. As an example, if $L_k$ is constant and $C_k(V_k)$ decreases with increasing voltage, then a higher-voltage portion of an input signal in the form of a pulse will travel faster through this section of the nonlinear transmission line than a lower-voltage portion of the pulse. This results in a steepening of the leading edge of the pulse and a slowing of the trailing edge. A numerical simulation (SPICE) displaying this effect is shown in FIG. 2.

The considerations of transition-time limitations, the number of varactor cells necessary for a particular amount of pulse shaping, and impedance matching have been discussed and analyzed to varying degrees of sophistication by other workers to describe the properties of travelling waves on nonlinear transmission lines in constant impedance environments. See, for example, R. B. Riley, "An Analysis of a Nonlinear Transmission Line," PhD. Dissertation, Stanford University, 1961; M. Birk and Q. A. Kerns, "Varactor Transmission Lines," Engineering Note EE-922, Lawrence Radiation Laboratory, University of California, May 22, 1963; H. Nagashima and Y. Amagishi, "Experiment on Solitons in the Dissipative Toda Lattice Using Nonlinear Transmission Line," Journal of the Physical Society of Japan, vol. 47, pp. 2021-2027, December 1979; and M. J. W. Rodwell, D. M. Bloom, and B. A. Auld, "Nonlinear Transmission Line for Picosecond Pulse Compression and Broadband Phase Modulation," Electronics Letters, vol. 23, pp. 109-110, Jan. 29, 1987. However, these references do not address problems associated with varactor diode turn-on and punch-through voltage limitations, soliton compression and inefficient use of varactor diode nonlinearity, reflections from mismatched load and source impedances, and ringing and soliton generation when it is not desired.

Considered in more detail, as discussed by Lundien, et al., "Hyperabrupt Junction Varactor Diodes for Millimeter-Wavelength Harmonic Generators," IEEE Trans. Microwave Theory and Techniques, vol. MTT-31, pp. 235-238, February 1983, and references cited therein, a varactor diode, when utilized for its nonlinear properties, is ideally meant to be operated over a voltage range bounded by the punch-through voltage of the varactor diode (the maximum usable reverse-bias voltage) and the turn-on voltage of the varactor diode (the maximum usable forward-bias voltage). The punch-through voltage $V_{deplete}$ is the voltage at which there is not further change in varactor capacitance. It is assumed that the breakdown voltage is greater than or equal to $V_{deplete}$.

These constraints are equally true for varactor diodes utilized in nonlinear transmission lines. Typically, known nonlinear transmission lines comprise a series of identical cells, each of which incorporates a single varactor diode having the same parametric values as the other varactor diodes in the other cells. Any portion of a pulse or step which exceeds $V_{deplete}$ of the varactor diode in a cell of a nonlinear transmission line will pass through that cell without being acted upon by the nonlinearity and therefore will be unchanged. This results in the inability to steepen or compress the entire step or pulse. Conversely, if the peak voltage of the propagating pulse or step is less than $V_{deplete}$, then the full nonlinearity of the varactor diode is not utilized. This results in less steepening and compression per unit length of nonlinear transmission line. In general, the highest power transfer efficiency and greatest steepening and compression are achieved when neither the turn-on voltage nor the breakdown voltage is exceeded and the full nonlinearity of the varactor diode in each cell is utilized without exceeding the punch-through voltage. There are two general areas where these ideal goals are difficult to achieve when using a series of identical single-varactor cells in nonlinear transmission lines.

First, some applications use voltages which are simply beyond the capabilities of a single-varactor cell from a given realizable varactor diode fabrication process. Accordingly, it would be desirable to provide a nonlinear transmission line which is not limited to a given varactor diode fabrication process and which can accommodate pulses and steps which would otherwise turn on and/or greatly exceed the punch-through voltage of a series of identical single-varactor cells.

Second, Tan, et al., U.S. Pat. No. 4,855,696 discloses a unique nonperiodic cell structure for a nonlinear transmission line, which allows the propagation and compression of a single soliton. An interesting feature of the disclosed pulse compressor is the increase in amplitude of the soliton as it propagates from the input of the nonlinear transmission line to the output. This causes each varactor diode in the pulse compressor to experience a different voltage excursion. When using a single varactor per cell and all of the varactor diodes have the same punch-through voltage, it is necessary for optimum performance to choose varactor parameters such that $V_{deplete}$ is equal to the highest peak voltage $V_{max}$ of the soliton on the pulse compressor. If $V_{max}$ exceeds $V_{deplete}$, the full-width-at-half-maximum (FWHM) of the output pulse is increased, the amount of uncompressed energy is increased, and the peak voltage amplitude is reduced when compared to the result if $V_{max}$ equals $V_{deplete}$. Because of the desirability to have $V_{max}$ equal to $V_{deplete}$, the full nonlinearity of the varactor diodes is not utilized in all the other cells where the peak voltage of the propagating soliton is much less than $V_{deplete}$. Accordingly, it would be desirable to provide a nonlinear transmission line which utilizes a greater range of the nonlinearity of the varactor diode in each cell and therefore produces increased pulse or step compression for a given length of nonlinear transmission line.

Additionally, when using only identical single-varactor cells from a given varactor diode fabrication process, only a limited range of steepening parameters and source and load impedances can be accommodated. Within these constraints the power transfer through the nonlinear transmission line should be maximized. However, power reflected from significantly mismatched load and source impedances can re-enter the nonlinear transmission line, reducing the power transfer from input to output. This occurs for two reasons.

First, low impedance sources and loads will invert the polarity of reflections. The inverted reflection has the proper polarity to forward bias and turn on varactor diodes in the nonlinear transmission line. Second, high impedance sources and loads step up the voltage of reflections. This will generate voltages which can exceed the punch-through voltage of the varactor diodes in the nonlinear transmission line. In addition, depending on the position of the mismatch with respect to the nonlinear transmission line and the resulting timing of the reflection, the reflection (both noninverted and inverted) can actually pass all the way back through the nonlinear transmission line. Accordingly, it would be desirable to provide a nonlinear transmission line which optimizes power transfer by minimizing reflections due to source and load impedance mismatches.

Furthermore, both Hirota, et al., "Theoretical and Experimental Studies of Lattice Solitons in Nonlinear Lumped Networks," Proc. IEEE, vol. 61, pp. 1483-1491, October 1973, and Kolosick, et al., "Properties of Solitary Waves as Observed on a Nonlinear Dispersive Transmission Line," Proc. IEEE, vol. 62, pp. 578-581, May 1974, describe experiments in which various types of pulses and steps are input to a nonlinear transmission line. They demonstrate that input pulses and steps eventually break up into one or more solitons if allowed to propagate for a sufficient time along a nonlinear transmission line. Also, as stated by Jager in "Characteristics of travelling waves along the non-linear transmission lines for monolithic integrated circuits: a review," Int. J. Elect., vol. 58, p. 662, 1985, "Any arbitrary initial signal decomposes into a well-defined superposition (non-linear) of individual solitary waveforms . . . " This phenomenon is exhibited by the steepening of the pulse or step until the risetime reaches approximately $2/f_c$ ($f_c$ is the cutoff frequency of the nonlinear transmission line), whereupon the greater dispersion forces the generation of oscillatory tails (or ringing) which then eventually decompose into solitons.

In applications where nonlinear transmission lines are used for edge sharpening (e.g., in samplers and step-generators) the generation of oscillatory tails is generally not welcome, since they can degrade circuit performance specifications related to flatness and stability. Accordingly, it would be desirable to provide a nonlinear transmission line in which ringing is suppressed without significantly affecting the overall risetime of the steepened edge.

SUMMARY OF THE INVENTION

In accordance with one embodiment of the invention, a nonlinear transmission line is provided which utilizes varactors having noncommensurate parametric values in various cells. This results in the ability to accommodate pulses and steps which would otherwise turn on and/or greatly exceed the punch-through voltage of a series of identical single-varactor cells.

Also, by utilizing varactor cells having noncommensurate parametic values, preferably stacked-varactor diode cells, the effective depletion voltage of selected cells increases, for example, by N. (N=2, 3, ... is the number of varactor diodes stacked in the cell.) Therefore, by using combinations of single-varactor diode cells and stacked-varactor diode cells in accordance with one embodiment of the invention, a greater portion of the nonlinearity of the varactor diode(s) in each cell can be utilized. This results in greater pulse or step compression in a given length of nonlinear transmission line or a shorter device length for a given pulse or step compression requirement.

Additionally, by the utilization of specific mixes of single-varactor diode cells and stacked-varactor diode cells in a nonlinear transmission line in accordance with one embodiment of the invention, it is possible to provide impedance matching. This alleviates the problems of degraded power transfer and reflections due to mismatched sources or loads.

Furthermore, in accordance with one embodiment of the invention, by utilizing one or more cells with varactors having noncommensurate parametric values at the output end of a nonlinear transmission line, oscillatory tails can be quenched without significantly affecting the overall risetime of the sharpened edge. This improves the flatness and stability of the circuit which utilizes the nonlinear transmission line.

The use of varactors having noncommensurate parametric values within some or all of the cells of a pulse compressor or any other nonlinear transmission line allows an additional degree of freedom for the customization and utilization in a wider variety of applications. This will become clearer in view of the following detailed description of various embodiments of the invention.

DETAILED DESCRIPTION OF THE PREFERRED EMBODIMENTS

Figure 1:
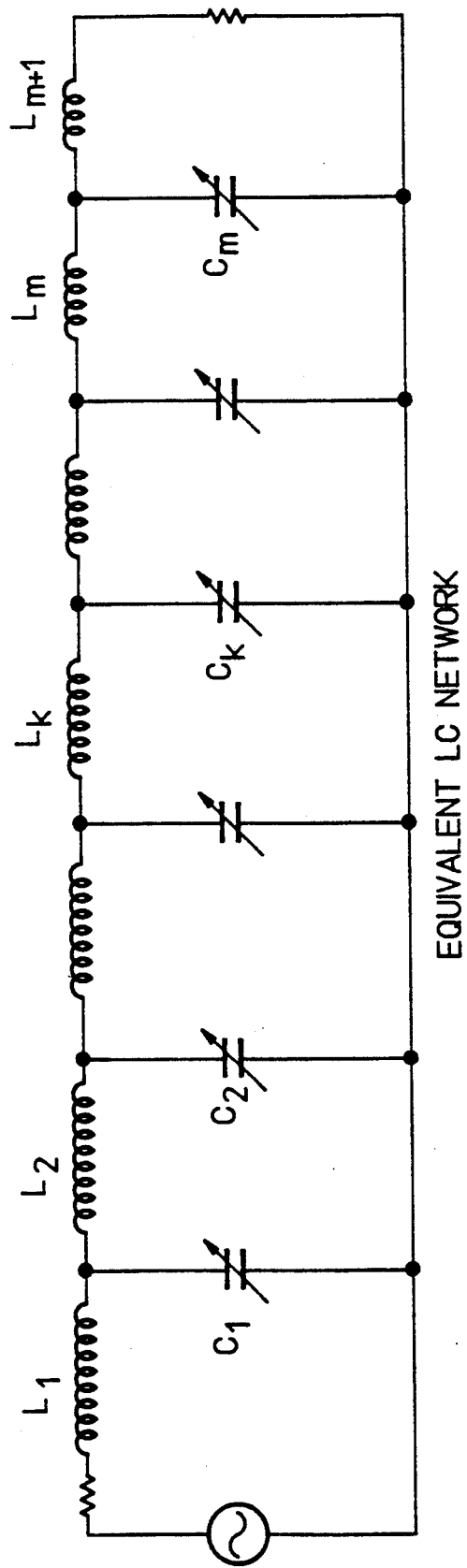
FIG. 1 is an equivalent circuit diagram of a nonlinear transmission line having voltage-variable capacitors.
Figure 2:
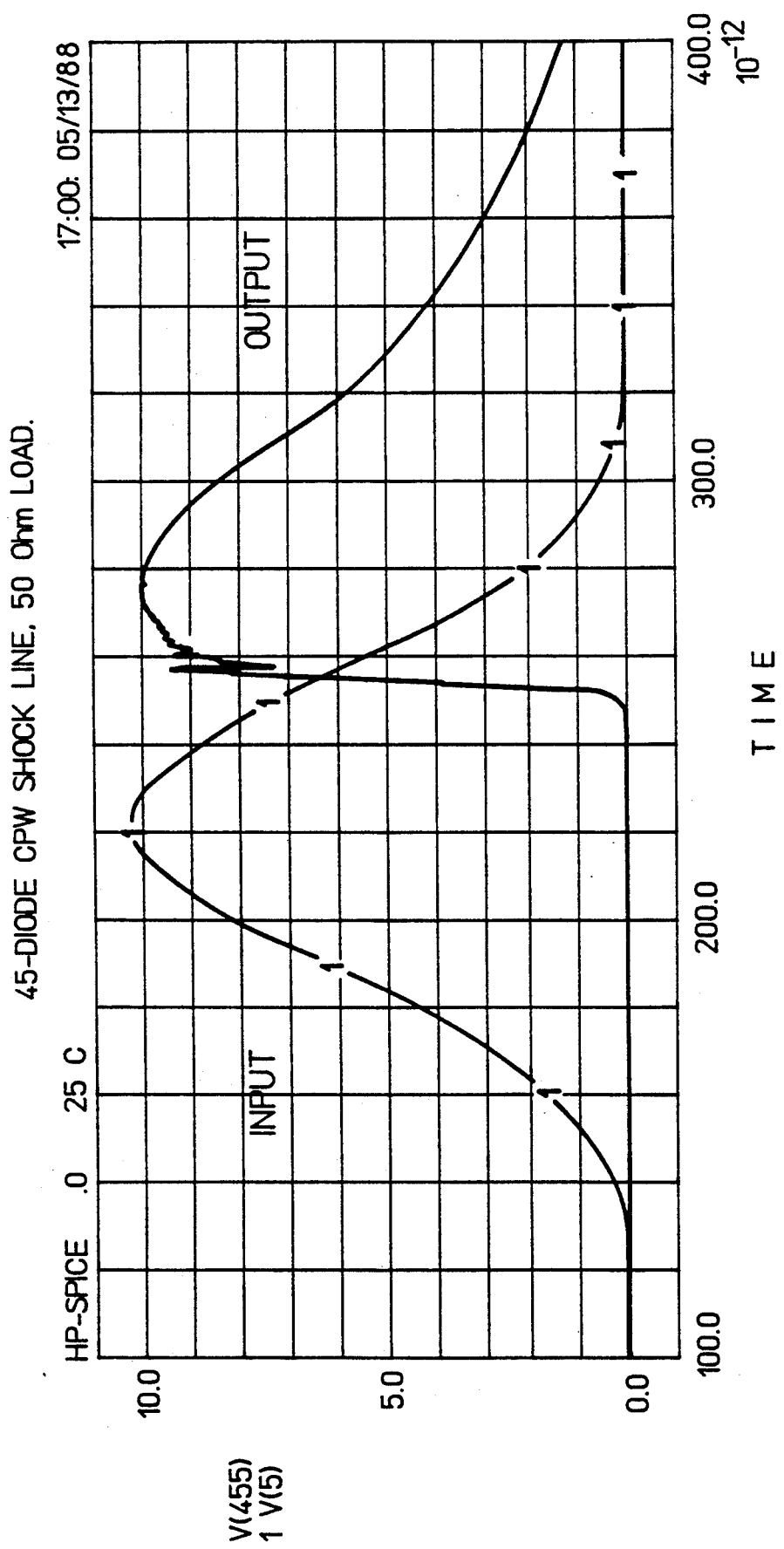
FIG. 2 illustrates a numerical simulation of the effect the nonlinear transmission line shown in FIG. 1 on an input signal due to decreasing capacitance with increasing voltage.
Figure 3A:
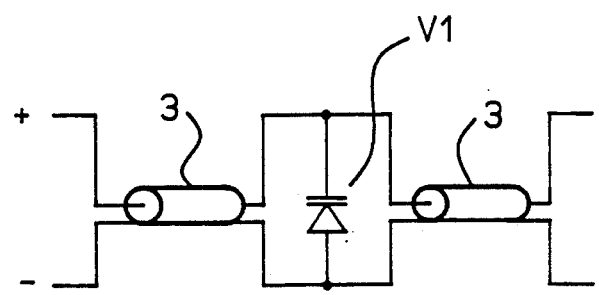
FIG. 3A is a schematic circuit diagram of a cell of a nonlinear transmission line utilizing a single varactor diode.
Figure 3B:
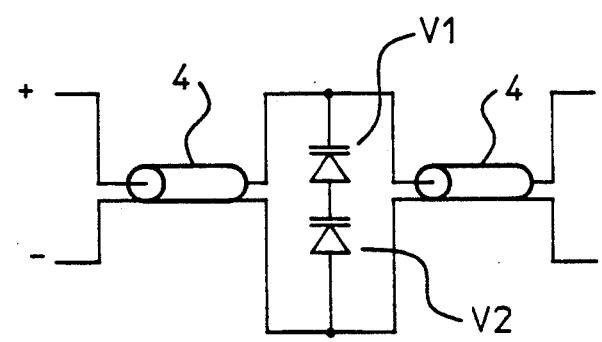
FIG. 3B is a schematic circuit diagram of a cell of a nonlinear transmission line utilizing two series- connected varactor diodes. This is referred to as a double-stacked varactor diode cell.
Figure 3C:
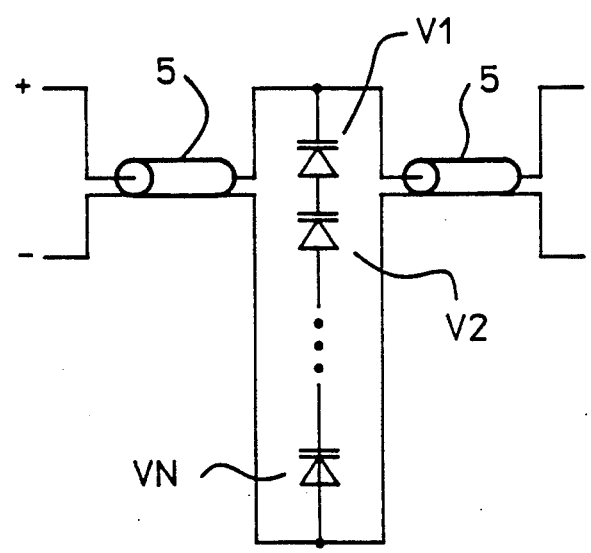
FIG. 3C is a schematic circuit diagram of a cell of a nonlinear transmission line utilizing N series- connected varactor diodes where N=2,3, . . . This is referred to as an N-stacked varactor diode cell.
Figure 3D:
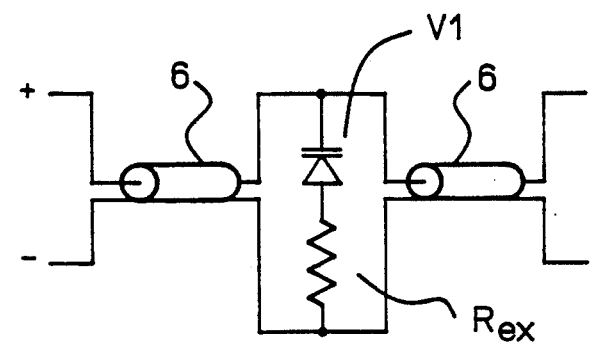
FIG. 3D is a schematic circuit diagram of a cell of a nonlinear transmission line utilizing one varactor diode in series with an extra resistance $R_{ex}$.

In accordance with various embodiments of the invention to be described below, a pulse compressor or other nonlinear transmission line is constructed utilizing specific combinations of varactor diode cells shown in FIGS. 3A, 3B, 3C, and/or 3D. With reference to FIG. 3A, a single varactor diode cell comprises a single varactor diode V1 interconnected in a length of transmission line 3. With reference to FIG. 3B, a double-stacked varactor diode cell comprises two varactor diodes V1, V2 connected in series and interconnected in a length of transmission line 4. With reference to FIG. 3C, an N-stacked varactor diode cell comprises N varactor diodes V1, V2, ..., VN connected in series and interconnected in a length of transmission line 5. With reference to FIG. 3D, a "damped varactor cell" comprises a single varactor diode V1 connected in series with an extra resistance $R_{ex}$ interconnected in a length of transmission line 6. The transmission line 3, 4, 5, or 6 in a given varactor cell has a length d and an impedance $Z_u$.

The varactor diodes V1, V2, ..., VN are diodes which are operated in reverse bias so as to produce a voltage-dependent capacitance $C_j(V)$. The capacitance variation of a varactor diode is typically modelled as $$C_j(V) = \frac{C_{jo}}{\left(1 + \frac{V}{V_b}\right)^a} \quad (2)$$

where $C_{jo}$ is the zero-bias capacitance, V is the voltage which reverse-biases the varactor diode, and $V_b$ is the barrier potential of the varactor diode junction. The grading coefficient a depends on the rate at which the doping density of the varactor changes, and $a>1$ for a hyperabrupt varactor. The capacitance per cell provided by the varactor diodes in a cell is chosen to be much larger than the capacitance of that cell introduced by the unloaded transmission line so that nonlinear capacitance of these varactors will introduce a significant nonlinearity in the capacitance per cell.

Figure 4:
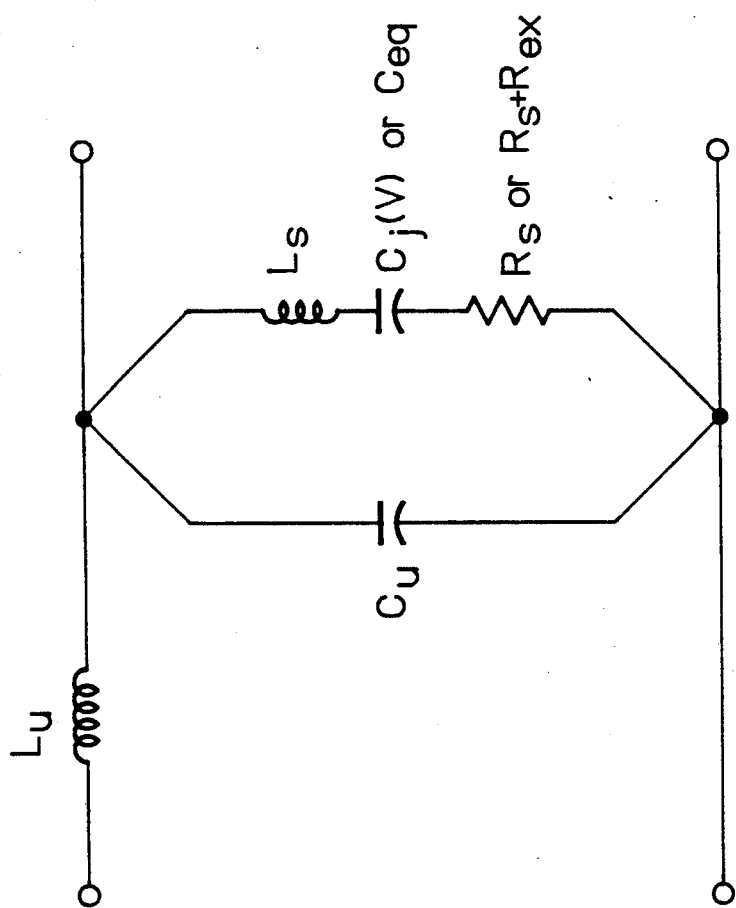
FIG. 4 is a generalized equivalent circuit for the varactor diode cells shown in FIGS. 3A, 3B, 3C, and 3D.

In FIG. 4 is shown an equivalent circuit of the varactor cells of FIGS. 3A, 3B, 3C, and 3D. $L_u$ is the inductance of the transmission line 3, 4, 5, or 6, and $C_u$ is the capacitance of the transmission line, such that $Z_u = \sqrt{L_u/C_u}$. $C_j(V)$ is the voltage-dependent capacitance of the varactor diode(s) V1, V2, ..., VN, $R_s$ is the series resistance of the varactor diode(s), and $L_s$ is the inductance of the connections to the varactor diode(s).

For purposes of further explanation, $C_{eq}$ can be considered an equivalent non-voltage-dependent capacitance which is defined to have the same change in charge as the varactor diode for a transition between the voltage levels $V_1$ and $V_2$ $$C_{eq} = \frac{\Delta Q}{\Delta V} \quad (3a)$$

where $$\Delta Q = \int_{V_1}^{V_2} C_j(V)dV \text{ and } \Delta V = V_2 - V_1. \quad (3b)$$

When N varactor diodes are stacked (connected in series) in a cell, as shown in FIG. 3C, the total capacitance is $$\frac{1}{C_j^{stack}(V)} = \sum_{i=1}^{N} \frac{1}{C_{j,i}(V)} \quad (4)$$

and the total series resistance is $$R_s^{stack} = \sum_{i=1}^{N} R_{s,i}. \quad (5)$$

For the case where all N varactor diodes are identical, the total capacitance is $$C_j^{stack} = \frac{C_{jo}}{N\left(1 + \frac{V}{NV_b}\right)^a}. \quad (6)$$

The equivalent capacitance of this stack is $$C_{eq}^{stack} = K_{eq}^{stack} C_{jo} \tag{7a}$$

where $$K_{eq}^{stack} = \frac{V_b}{(V_2 - V_1)(1-a)} \left\{ \left(1 + \frac{V_1}{NV_b}\right)^{1-a} - \left(1 + \frac{V_2}{NV_b}\right)^{1-a} \right\} \tag{7b}$$

and the equivalent series resistance is $R_s^{stack} = NR_s$.

Finally, with reference to FIG. 4, $R_{ex}$ is a separate additional resistance placed in series with a single varactor diode in the case of the varactor cell shown in FIG. 3D. The equivalent circuit elements determine the cutoff frequency and the propagation delay through the varactor cell.

Now, a varactor diode is ideally meant to be operated over a voltage range bounded by $$0 \leq |V_{low}| < |V_{on}| \tag{8a}$$

$$|V_{high}| = |V_{deplete}| \leq |V_{bd}| \tag{8b}$$

where $V_{low}$ is the low-voltage point and $V_{high}$ is the high-voltage point of the input waveform. $V_{on}$ is the turn-on voltage and $V_{bd}$ is the breakdown voltage of the varactor diode. The punch-through voltage $V_{deplete}$ is the voltage at which the varactor diode becomes fully depleted yielding no further change in capacitance. Eqn. (2) is valid within the bounds of Eqn. (8). Setting $C_j(V_{deplete}) = C_{min}$ and solving Eqn. (2) for $V_{deplete}$ yields $$V_{deplete} = V_b \left\{ \left(\frac{C_{jo}}{C_{min}}\right)^{1/a} - 1 \right\}. \tag{9}$$

The varactor diode fabrication process technology and doping parameters of the varactor diode will set $V_b$, $C_{jo}/C_{min}$, and a.

Now, if either $|V_{low}| > |V_{on}|$ or $|V_{high}| > |V_{bd}|$ then the propagating pulse or step will be clipped by the varactor diodes. In addition, the nonlinear transmission line will begin to self-bias when conduction current flows through the varactor diodes. This will reduce the steepening ability of the nonlinear transmission line, as well as reduce the efficiency of power transfer through the nonlinear transmission line from source to load. $V_{on}$ and $V_{bd}$ can be increased to avoid clipping the pulse or step by either utilizing varactor diodes with larger barrier heights $V_b$, since $V_b$ has a direct effect on $V_{on}$ and $V_{bd}$, or by connecting N varactor diodes in series yielding $V'_{on} = NV_{on}$ and $V'_{bd} = NV_{bd}$. Utilizing varactor diodes with larger barrier heights has only limited range, especially in the case of $V_{on}$ where at most $V_{on}$ can be increased by 50%. In contrast, series-connecting varactor diodes has no such limitation, since both $V_{on}$ and $V_{bd}$ scale with N.

Also, if $|V_{high}| < |V_{deplete}|$, then the full nonlinearity of the varactor diode is not utilized. This results in less steepening and compression per unit length of nonlinear transmission line. $V_{deplete}$ can be decreased (refer to Eqn. (9)) by utilizing varactor diodes with larger a, utilizing varactor diodes with smaller ($C_{jo}/C_{min}$), and/or utilizing varactor diodes with smaller $V_b$. However, since $V_b$ has a direct effect on $V_{on}$ and $V_{bd}$, the third alternative may not be desirable.

Finally, if $|V_{high}| > |V_{deplete}|$, there will be no further change in capacitance for that portion of the pulse or step which exceeds $|V_{deplete}|$. Any portion of a pulse or step which exceeds $|V_{deplete}|$ of the varactor diode in a cell of a nonlinear transmission line will pass through that cell without being acted upon by the nonlinearity of the varactor and therefore will be unchanged. This results in the inability to steepen or compress the entire step or pulse. $V_{deplete}$ can be increased (refer to Eqn. (9)) by utilizing varactor diodes with smaller a, utilizing varactor diodes with larger ($C_{jo}/C_{min}$), utilizing varactor diodes with larger $V_b$, and/or connecting N varactor diodes in series yielding $V'_{deplete} = NV_{deplete}$. Accordingly, the only apparently consistent approach is series-connecting N varactor diodes.

Figure 5:
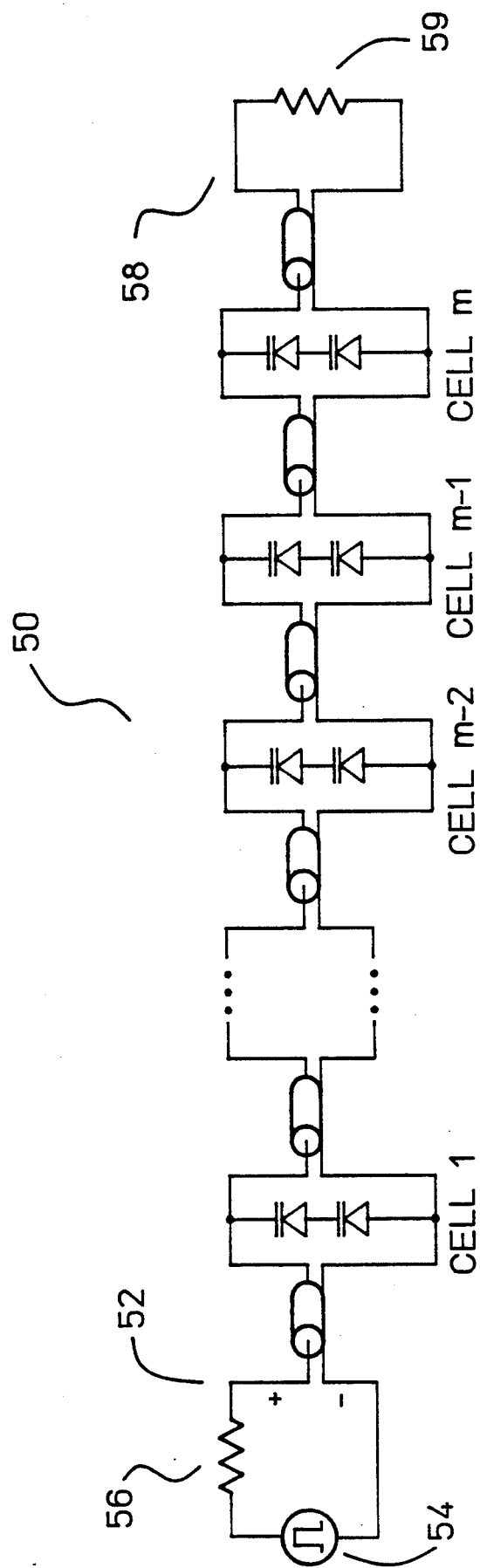
FIG. 5 is a schematic circuit diagram of a nonlinear transmission line having N-stacked (N=2) varactor diode cells.

In general, FIG. 5 shows a nonlinear transmission line which can propagate pulses and steps that would otherwise turn on and/or greatly exceed the punch-through voltage (or breakdown voltage) of a single varactor diode. With reference to FIG. 5, a nonlinear transmission line 50 is configured such that all its m varactor cells utilize stacked varactor diodes. An input port 52 is connected to a pulse or step generator 54 through a source impedance 56. An output port 58 is connected to a load impedance 59. FIG. 5 shows that all varactor cells contain double-stacked varactors (FIG. 3B), which yields effective turn-on, punch-through, and breakdown voltages that are twice the turn-on, punch-through, and breakdown voltages of a single varactor. Using N-stacked varactor diodes (FIG. 3C) in all varactor cells yields effective turn-on, punch-through, and breakdown voltages that are N times greater than the turn-on, punch-through, and breakdown voltages of a single varactor.

Now, a particular problem occurs if only condition (8a) is exceeded but not condition (8b). That is, if $|V_{on}| = 0.5$ volt and $|V_{low}| = 0.9$ volt but $|V_{deplete}| = 11$ volt and $|V_{high}| \approx 11$ volt it is necessary to use double-stacked varactors (N=2) in all cells of the nonlinear transmission line to prevent turn-on. However, $|V_{high}|$ is now only half of the voltage necessary to fully deplete both varactors. As a result of the lower change in capacitance, a longer nonlinear transmission line will be required to achieve the required amount of steepening, which in turn results in greater insertion loss. The solution to this problem is to reduce $V_{deplete}$ by utilizing varactor diodes with larger a, utilizing varactor diodes with smaller ($C_{jo}/C_{min}$), and/or utilizing varactor diodes with smaller $V_b$. If designed correctly, this more abrupt doping profile will yield the same change in capacitance across two varactor diodes as the change in capacitance across a single varactor diode using the original doping profile.

Now, the fastest transition which can propagate through a varactor cell is $$t_{min} = \frac{2.2}{\omega_{3dB}}. \tag{10}$$

The "3 dB cutoff frequency" of the cell is that frequency $\omega_{3dB}$ where the transfer function through the varactor cell $|V_{out}/V_{in}|$ has decreased by $1/\sqrt{2}$ with respect to its value at $\omega = 0$. To generate and propagate the fastest step edges or shortest pulsewidths, it is desirable to configure the varactor cells such that $\omega_c$ is as large as possible and $\omega_r >> \omega_c$ where $$\omega_c = \frac{2}{\sqrt{L_u C_{eq}}} \text{ and } \omega_r = \frac{1}{R_s C_{eq}} \quad (11)$$

and $\omega_{3dB}$ is a complicated function of both $\omega_r$ and $\omega_c$ in which $\omega_{3dB}$ monotonically decreases as either $\omega_r$ and/or $\omega_c$ decreases.

Using the equivalent circuit show in FIG. 4

$$Z_a = j\omega \frac{L_u}{2} \text{ and } Z_b = \frac{1}{j\omega(C_u + C_j(V))}, \quad (12)$$

the phase coefficient $\beta$ is given by $$\beta = 2 \arcsin\left(\frac{\omega}{2} \sqrt{L_u(C_u + C_j(V))}\right), \quad (13)$$

and the voltage-dependent time delay through the varactor cell for $\omega << \omega_c$ is $$T(V) = \frac{d\beta}{d\omega} \approx \tau \sqrt{1 + C_j(V)/C_u} \quad (14)$$

where $\tau = \sqrt{L_u C_u}$. If the input pulse to varactor cell k transitions from $V_1$ to $V_2$ in a time $t_{in,k}$, at the output of the cell the transition time will be $$t_{out,k} = MAX(t_{min}, t_{in,k} - \Delta T_k) \quad (15)$$

where $$\Delta T_k = \tau(\sqrt{1 + C_{j,k}(V_1)/C_{u,k}} - \sqrt{1 + C_{j,k}(V_2)/C_{u,k}}) \quad (16)$$

and the function MAX means that the output transition time cannot be less than $t_{min}$ as defined by Eqn. (10). By cascading m varactor cells, as shown in FIG. 3C, the output transition time is related to the input transition time by $$t_{out} = MAX\left(t_{min}, t_{in} - \sum_{k=1}^{m} T_k\right). \quad (17)$$

Therefore, to achieve a substantial amount of steepening in as short a nonlinear transmission line as possible, the varactor diodes should dominate the transmission line characteristics, and the change in capacitance with voltage should be very large such that $$C_j(V_1) >> C_j(V_2) >> C_u. \quad (18)$$

Figure 6:
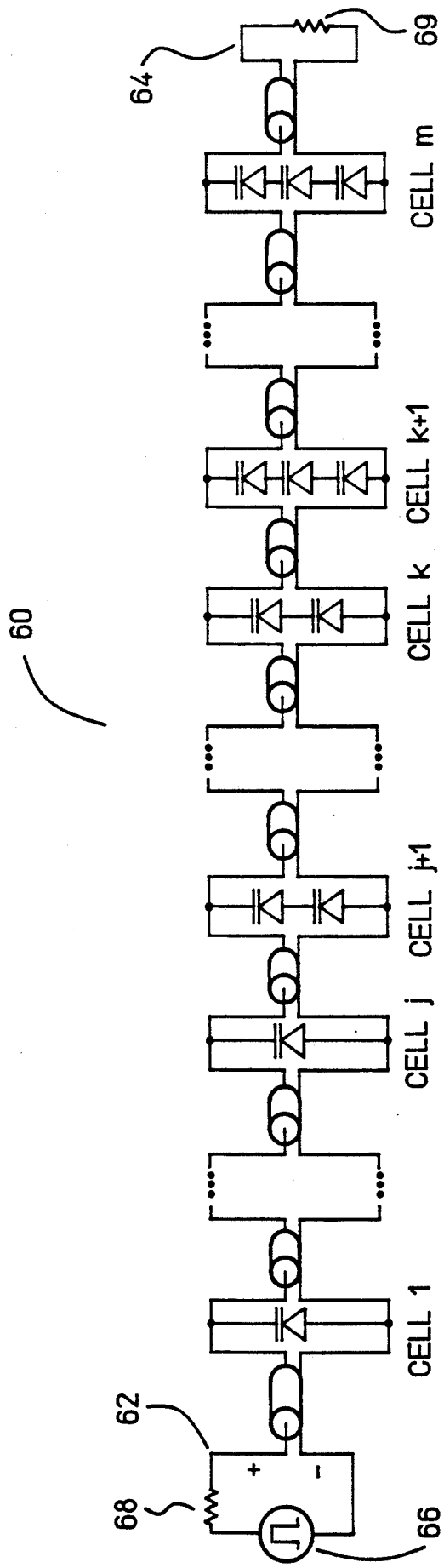
FIG. 6 is a schematic circuit diagram of a nonliner transmission line in accordance with one embodiment of the invention comprised of both single varactor diode cells and stacked varactor diode cells.

Accordingly, a nonlinear transmission line in accordance with one embodiment of the invention is shown in FIG. 6. With reference to FIG. 6, a nonlinear transmission line 60 has an input port 62 and an output port 64. The input port 62 is connected to a pulse generator 66 through a source impedance 68. The output port 64 is connected to a load impedance 69. The nonlinear transmission line 60 is constructed of m varactor cells. Ideally, each varactor diode should be individually chosen such that the punch-through voltage $V_{deplete}$ of the varactor diode in each cell k is equal to the peak voltage of the soliton $V_{peak,k}$ in that cell. The compression per unit length increases as both a and $C_{jo}/C_{min}$ increase (refer to Eqn. (9)). Hence, a and $C_{jo}/C_{min}$ should be set as high as possible within the constraints that $V_{deplete} = V_{peak,k}$ and that the series resistance $R_s$ of the varactor diode remains small enough such that $\omega_r << \omega_c$. It is assumed that all of the varactor diodes have the same punch-through voltage. Varactor cells 1 through j are single-varactor cells (FIG. 3A). Varactor cells j+1 through k are double-stacked varactor cells (FIG. 3B). Cells k+1 through m are triple-stacked varactor cells (FIG. 3C with N=3). The selection of the equivalent circuit parameters of FIG. 4 for each varactor cell and the technology used for implementation of the nonlinear transmission line 60 shown in FIG. 6 follows the methodology disclosed in U.S. Pat. No. 4,855,696 for the configuration of pulse compressors with a varactor diode fabrication process selected in view of the following additional criteria.

First, the peak amplitude of the soliton when it reaches varactor cell j shown in FIG. 6 is sufficient to fully deplete the single varactor diode in cell j. However, the peak amplitude of the soliton when it is in the preceding varactor cells is insufficient to fully deplete the varactor diodes in these cells.

Second, the peak amplitude of the soliton when it reaches varactor cell k shown in FIG. 6 is sufficient to fully deplete the double-stacked varactors in cell k. However, the peak amplitude of the soliton when it is in varactor cells j+1 through k−1 is insufficient to fully deplete the double-stacked varactor diodes in these cells.

Third, the peak amplitude of the soliton when it reaches varactor cell m shown in FIG. 6 is sufficient to fully deplete the triple-stacked varactors in cell m. However, the peak amplitude of the soliton when it is in varactor cells k+1 through m−1 is insufficient to fully deplete the triple-stacked varactor diodes in these cells.

In general, the addition of another varactor diode to a varactor cell to create a stack or increase a stack from N varactors to N+1 varactors is determined as follows. Specifically, the addition of another varactor diode occurs at the varactor diode cell where the amplitude of the propagating soliton is sufficient to fully deplete the varactor(s) in the cell if the additional varactor were not present.

In one implementation of the nonlinear transmission line 60 shown in FIG. 6 the following parameters were used: total line length=3.21 mm, $Z_u$=150Ω, $V_b$=0.9 volt, a=1.8, $C_{jo}/C_{min}$=35, and $V_{deplete}$=5.6 volt. $C_{jo,k}$ of each varactor diode, the number N of varactor diode(s) in each varactor cell k, and the delay times $\tau_k$ were:

| k | N | $C_{jo,k}$ (pF) | $\tau_k$ (ps) |
|---|---|---|---|
| 1 | 1 | 3.09 | 6.67 |
| 2 | 1 | 2.88 | 4.85 |
| 3 | 1 | 2.65 | 3.82 |
| 4 | 2 | 2.69 | 3.07 |
| 5 | 2 | 2.36 | 2.49 |
| 6 | 2 | 2.04 | 2.00 |
| 7 | 2 | 1.69 | 1.61 |
| 8 | 3 | 1.44 | 1.25 |
| 9 | 3 | 1.03 | 0.94 |
| 10 | 3 | 0.63 | 0.67 |

Figure 7A:
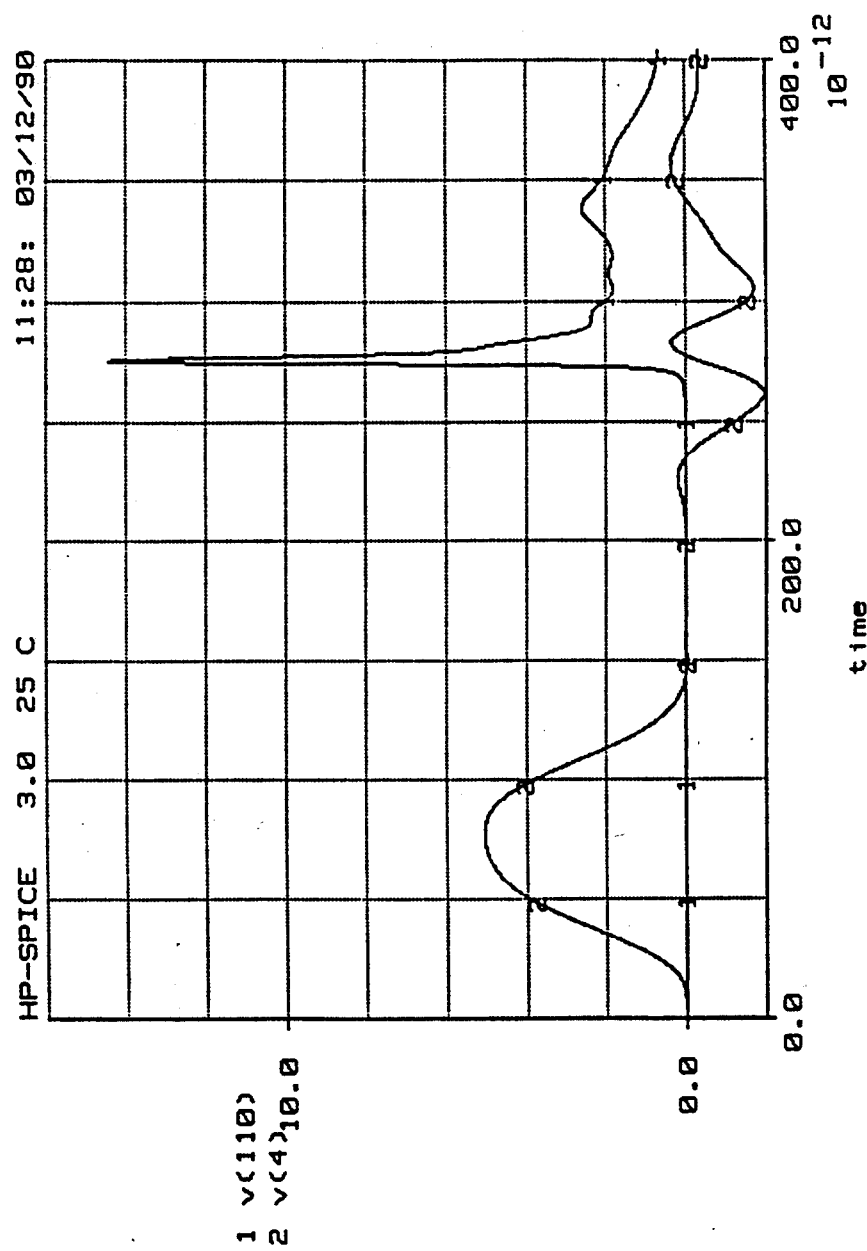
FIG. 7A illustrates a numerical simulation of the nonlinear transmission line shown in FIG. 6 showing amplitude enhancement and compression of an input pulse.
Figure 7B:
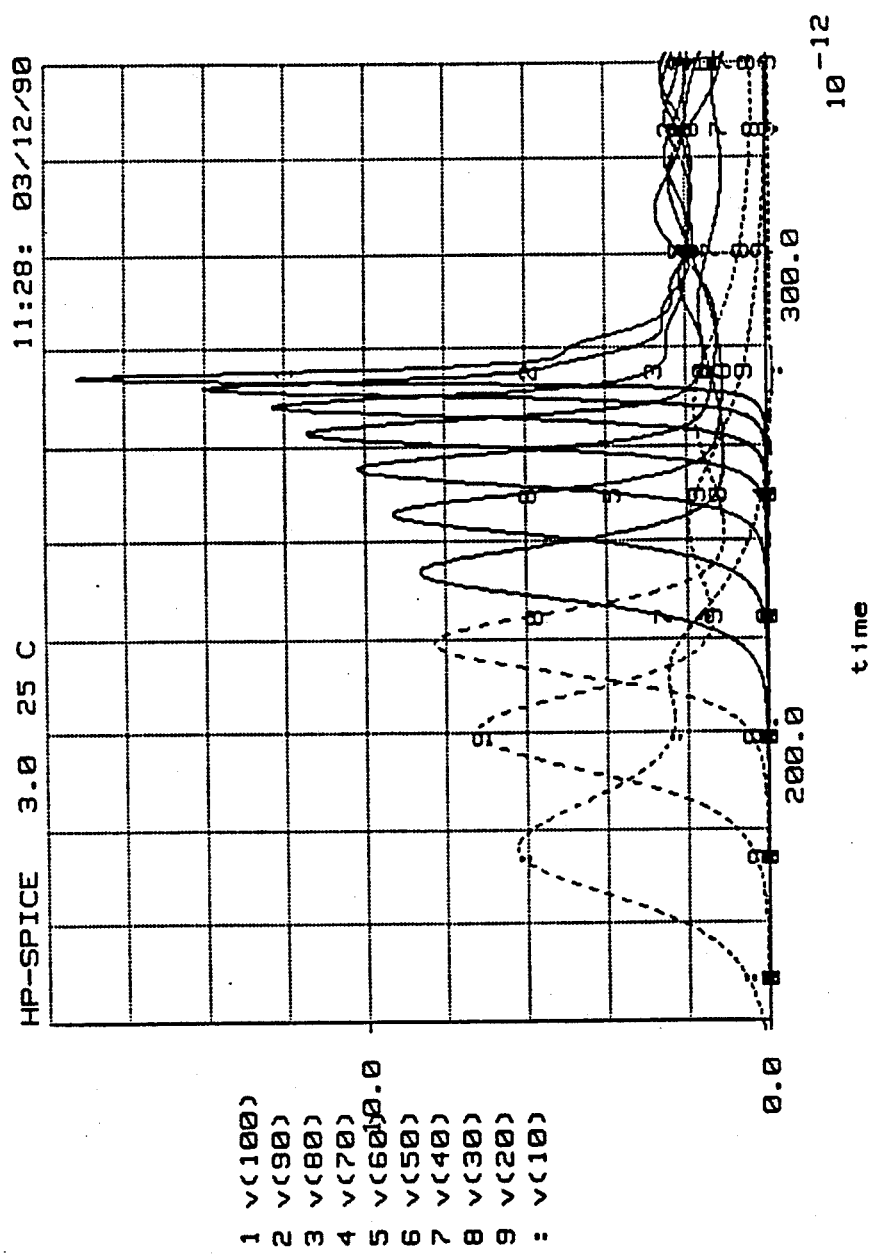
FIG. 7B illustrates a numerical simulation of the voltage at each varactor cell in the nonlinear transmission line shown in FIG. 6.

FIG. 7 shows a numerical (SPICE) simulation of the nonlinear transmission line 60 shown in FIG. 6. FIG. 7A shows an input pulse with a FWHM=70 ps and a peak voltage of 5 volt. The output is a single soliton with FWHM=4 ps and a peak amplitude of 14.2 volt. FIG. 7B shows the voltage at each varactor cell location in the nonlinear transmission line 60.

In summary, by utilizing combinations of single-varactor cells, and stacked-varactor cells it is possible to make use of a greater portion of the nonlinearity of the varactor diode(s) in each cell. This results in greater compression of the input pulse and less uncompressed energy in the tail in the same device length, or a similar amount of compression in a shorter device length when compared to a nonlinear transmission line not utilizing mixes of varactor cells having single and stacked varactor diodes.

Additionally, the image impedance of a nonlinear transmission line varactor cell shown in FIG. 4 is given by $$Z_k(V,\omega) = \frac{Z_{u,k}}{\sqrt{1 + C_{j,k}(V)/C_{u,k}}} \sqrt{1 - (\omega/\omega_{c,k})^2} \quad (19)$$

where $Z_{u,k} = \sqrt{L_{u,k}/C_{u,k}}$. The conditions of Eqn. (18) imply that the nonlinear transmission line impedance varies greatly as the input voltage sweeps from $V_1$ to $V_2$. Also, there is significant change in $Z_k(V,\omega)$ as $\omega$ approaches $\omega_{c,k}$. Using the equivalent capacitance of Eqn. (3), an equivalent impedance can be defined as $$Z_{eq,k} = \frac{Z_{u,k}}{\sqrt{1 + C_{eq,k}/C_{u,k}}} \sqrt{1 - (\omega/\omega_{c,k})^2} \; . \quad (20)$$

If $Z_{eq,k}$ of all of the varactor cells is identical and if the source and load impedances are equal and resistive, then to maintain good impedance match and efficient power transfer through the nonlinear transmission line while at the same time maintaining the conditions of Eqn. (18), it is desirable to make $Z_u$ as high as possible and to set $Z_{eq}$ (by the appropriate choices of $C_{eq,k}$ and varactor diode spacing) approximately equal to $R_{source} = R_{load} = R$. Maximum power transfer from input to output through a nonlinear transmission line is accomplished by choosing varactor diode parameters and spacing such that the impedance $Z_{eq}$ of the nonlinear transmission line is equal to the source and load impedances. However, attempting to change the impedance $Z_{eq}$ of a nonlinear transmission line cell to greater than 0.6 $Z_u$ or to less than 0.3 $Z_u$ requires compromises which can significantly degrade the steepening ability and speed of the nonlinear transmission line due to varactor diode size and $R_s$ limitations. Also, because $Z_{eq}$ is frequency dependent, the impedance match rapidly degrades for those frequencies $\omega$ which exceed 0.6 $\omega_c$. The broadband match can be improved by using m-derived constant-k networks (G. L. Matthaei, L. Young, and E. M. T. Jones, Microwave Filters, Impedance Matching Networks, and Coupling Structures, (Artech House, 1980), p. 60-77) in the input and output cells of the nonlinear transmission line as is generally done in distributed amplifiers (E. L. Ginzton, W. R. Hewlett, J. H. Jasberg, and J. D. Noe, "Distributed Amplification," Proc. IRE, vol. 36, p. 956-969, August 1948). This yields good impedance matching up to 0.9 $\omega_c$.

Figure 8:
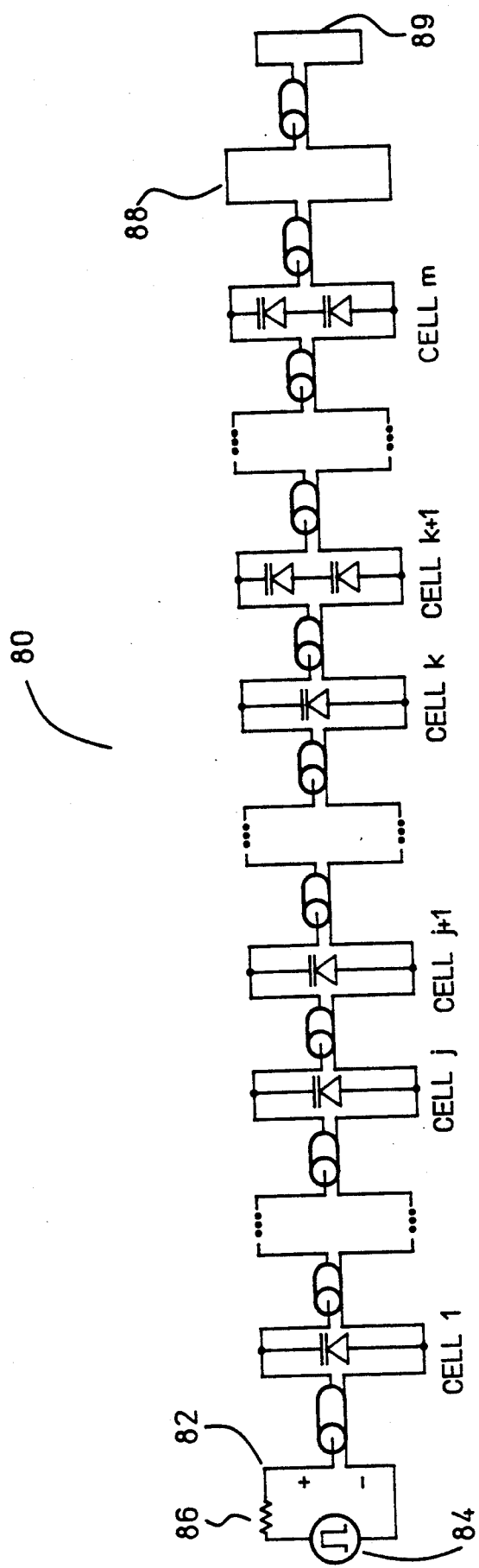
FIG. 8 is a schematic circuit diagram of a nonlinear transmission line in accordance with another embodiment of the invention comprising stacked varactor diode cells nearest the output to provide impedance matching.

Accordingly, a nonlinear transmission line in accordance with another embodiment of the invention configured to improve power transfer from source to load is shown in FIG. 8. With reference to FIG. 8, a nonlinear transmission line 80 is constructed utilizing m varactor cells. Varactor cells 1 through j have a large-signal impedance $Z_1$, cells j+1 through k have a large-signal impedance $Z_2$, and cells k+1 through m have a large-signal impedance $Z_3$. An input port 82 is connected to a pulse or step generator 84 through a source impedance 86 having a value $Z_s$. An output port 88 is connected to a transmission line with impedance $Z_4 > Z_s$ which is in turn connected to a load impedance 89 having a value $Z_L$. The load impedance 89 is a short circuit with $Z_L = 0$. The double-stacked varactor diodes in cells k+1 through m are used to accommodate the step-up in voltage due to the high impedance at the output, allow the varactor diodes to be sized larger to prevent design rule violations and excessively high series resistance, reduce self-bias effects due to the inverted reflection from the low-impedance load, and absorb a greater portion of the inverted reflection from the low-impedance load, thereby reducing the level of re-reflected energy back to the load.

Figure 9A:
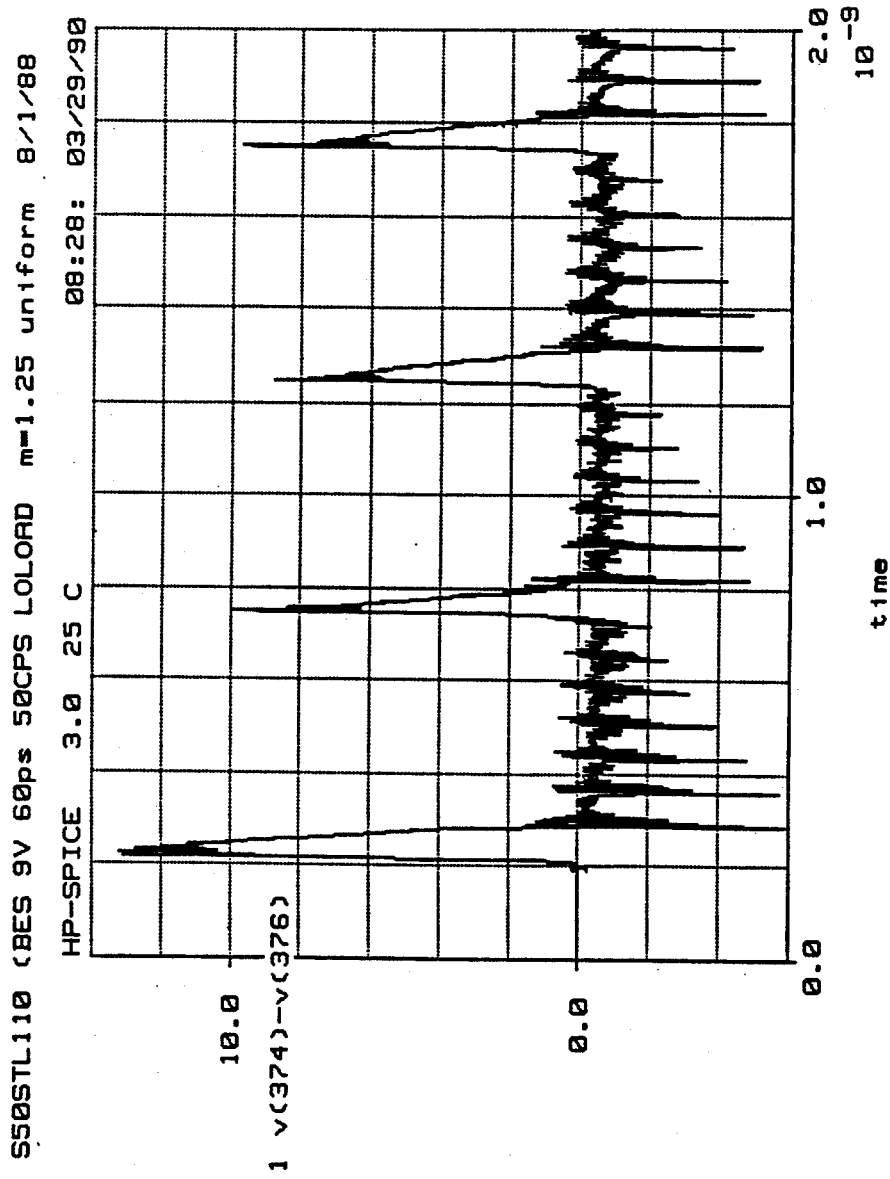
FIG. 9A illustrates a numerical simulation of a nonlinear transmission line having a short for a load.

FIG. 9A shows a numerical simulation (SPICE) of the voltage at the output port of a 36-cell nonlinear transmission line in which each of the thirty-six cells is identical and has the following parameters: $L_u = 60$ pH, $C_u = 3$ fF, $C_{jo} = 200$ fF, a=1.25, $V_b = 0.9$ volt, $C_{eq} = 36$ fF, and $R_s = 22\Omega$. The cutoff frequencies of each cell are $\omega_r = 1.26 \times 10^{12}$ rad/sec and $\omega_c = 1.36 \times 10^{12}$ rad/sec. With $\omega_c/\omega_r = 1.08$, $\omega_{3dB} = 0.5\omega_c$, and $t_{min} \approx 3.2$ ps, as given by Eqn. (10). $Z_s = 50\Omega$, and $Z_4 = 100\Omega$. The source is a 2 GHz pulse generator producing input pulses with 9 volt amplitudes and 10%–90% risetimes of 60 ps. Although the source is producing pulses with transitions between $V_1 = 0$ volt and $V_2 = 9$ volt, the nonlinear transmission line is self-biasing (i.e., the output pulses transition between $V_1 \approx -0.7$ volt and $V_2 \approx 9$ volt) due to the reflection from the short-circuit load. Also, note the large amount of ringing at the output.

Figure 9B:
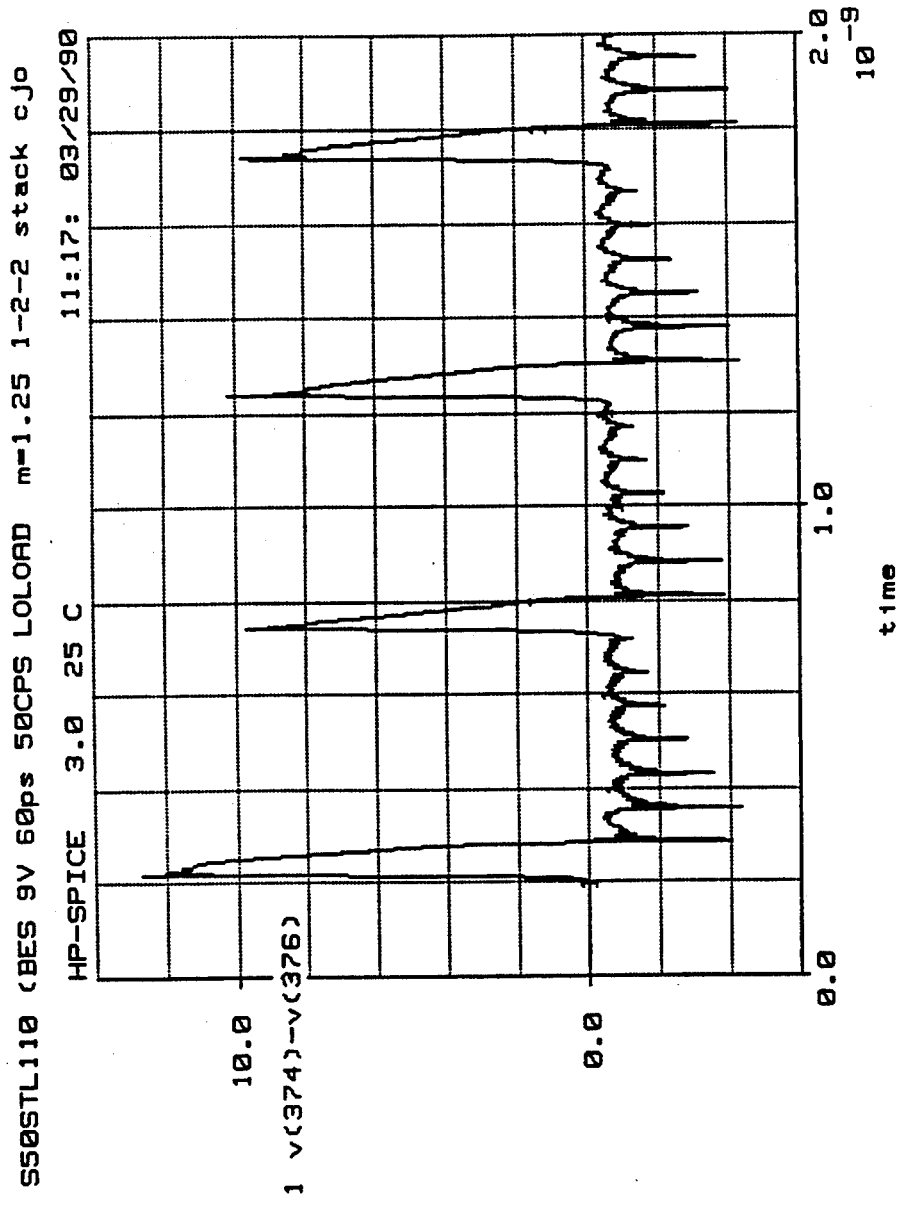
FIG. 9B illustrates a numerical simulation of the nonlinear transmission line shown in FIG. 8 having a short for a load.

FIG. 9B shows a numerical simulation (SPICE) of the voltage at the output port 88 of a 36-cell nonlinear transmission line 80 of the form shown in FIG. 8. The varactor diode parameters in each varactor cell k and the number N of varactor diodes stacked in each cell are:

| k | N | $C_{jo,k}$ (fF) | $R_{s,k}$ ($\Omega$) |
|---|---|---|---|
| 1–12 | 1 | 200 | 22 |
| 13–22 | 1 | 175 | 26 |
| 23–36 | 2 | 260 | 18 |

All of the varactor diodes have a=1.25 and $V_b = 0.9$ volt. All of the varactor cells have $L_u = 60$ pH and $C_u = 3$ fF.

The output shown in FIG. 9B shows approximately equal peak voltages as compared to the output shown in FIG. 9A. There is, however, significantly less ringing in the output shown in FIG. 9B.

Now, in view of Eqn. (11), $\omega_{3dB}$ can be decreased by decreasing $\omega_r$ and/or $\omega_c$ by utilizing a varactor diode with larger $C_{eq}$ and/or larger $R_s$ and/or connecting two or more varactor diodes in series. Depending on how the varactor diodes are sized, $R_s^{stack}$ and/or $C_{eq}^{stack}$ can be increased. By adding more than one varactor cell with reduced $\omega_{3dB}$, greater damping of high-frequency ringing is accomplished. However, reducing $\omega_{3dB}$ of a varactor cell(s) within a nonlinear transmission line comes at the expense of slowing the speed of any voltage transition that can pass through the entire device, as given by Eqn. (10).

Figure 10:
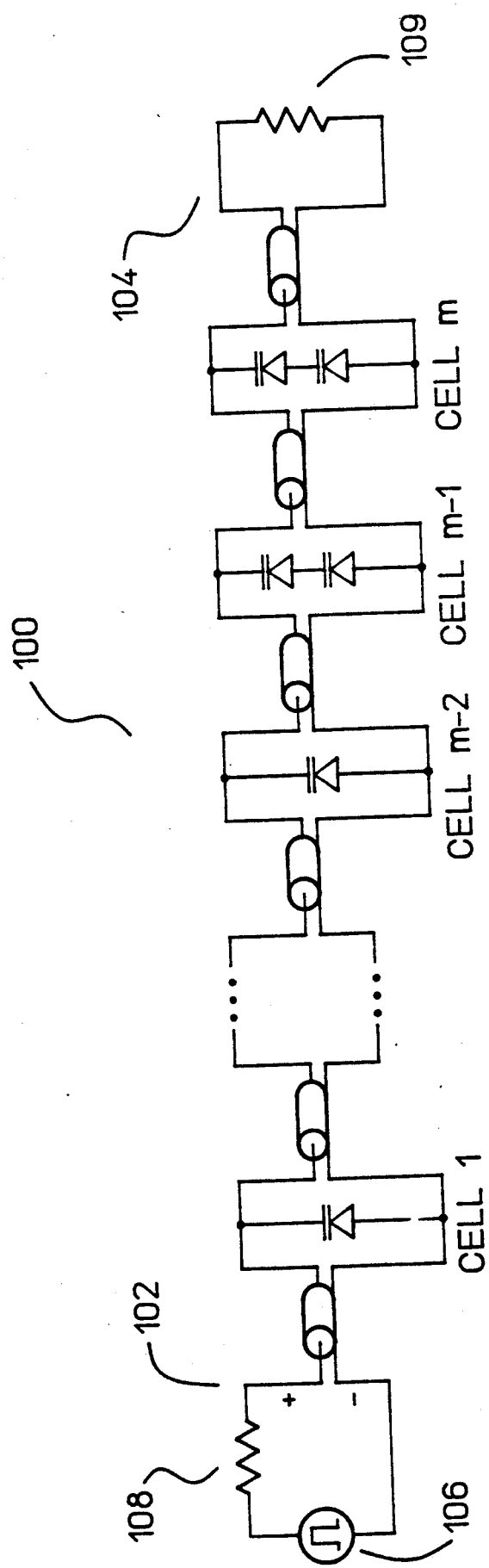
FIG. 10 is a schematic circuit diagram of a nonlinear transmission line in accordance with a further embodiment of the invention comprising stacked varactor diodes only in the last two varactor cells nearest the output.

A nonlinear transmission line in accordance with a further embodiment of the invention to quench oscillatory tails is shown in FIG. 10. With reference to FIG. 10, a "quenching shockline" comprises a nonlinear transmission line 100 having an input port 102 and an output port 104. The input port 102 is connected to a pulse or step generator 106 through a source impedance 108. The output port 104 is connected to a load impedance 109. The quenching shockline is constructed of m varactor cells. Cells 1 through m−2 are single-varactor cells (FIG. 3A) and the last two cells are double-stacked varactor cells (FIG. 3B). The stacked varactor diodes in the last two varactor cells are configured to yield a reduced change in voltage-variable capacitance $C_j(V)$ and larger $R_s$ (FIG. 4), resulting in a lower dynamic cutoff frequency $\omega_{3dB}$ in these cells. The stacked varactor cells significantly attenuate the very high frequency harmonics generated in the previous cells, which cause the oscillatory tails (ringing).

Figure 11A:
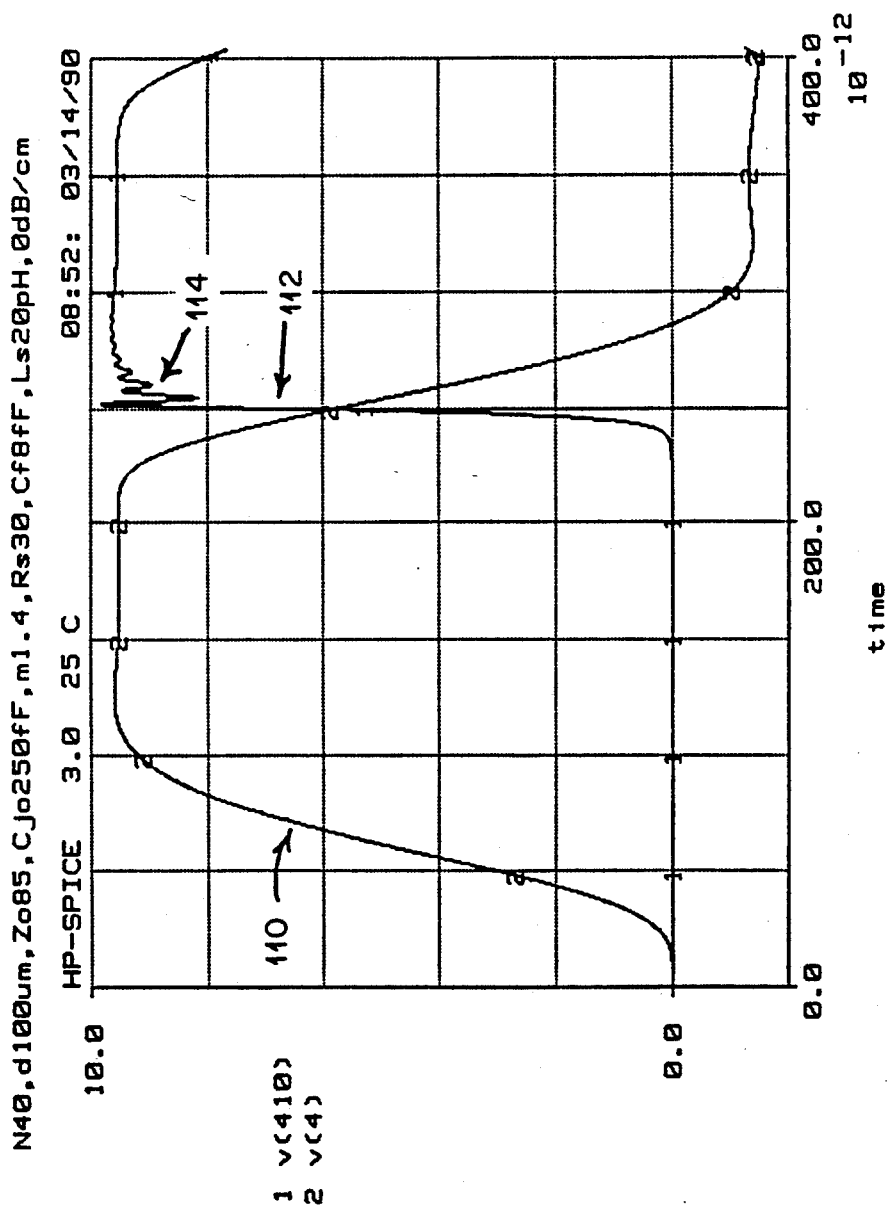
FIG. 11A is a numerical simulation of a nonlinear transmission line with the stacked varactor diodes of FIG. 10 replaced with conventional single varactor diode cells.

FIG. 11A shows a numerical (SPICE) simulation of the step response of a 40-cell nonlinear transmission line without stacked cells at its output. Each of the forty cells is identical and has the following parameters: $Z_u=85\Omega$, $d=100$ μm, $L_u=80$ pH, $C_u=11$ fF, $C_{jo}=250$ fF, $a=1.4$, $V_b=0.9$ volt, $C_{eq}=37$ fF, and $R_s=30\Omega$. The cutoff frequencies of each varactor cell are $\omega_r=9.0\times10^{11}$ rad/sec and $\omega_c=1.2\times10^{12}$ rad/sec. With $\omega_c/\omega_r=1.3$, $\omega_{3dB}=0.47\omega_c$ and $t_{min}\approx4$ ps as given by Eqn. (10). The source and load impedances are 50Ω. The input step 110 has a 9.5 volt amplitude and a 10%–90% risetime of 55 ps. The output 112 is a steepened step with a 6.3 ps 10%–90% risetime but with significant ringing 114 of 1.6 volt peak-to-peak.

Figure 11B:
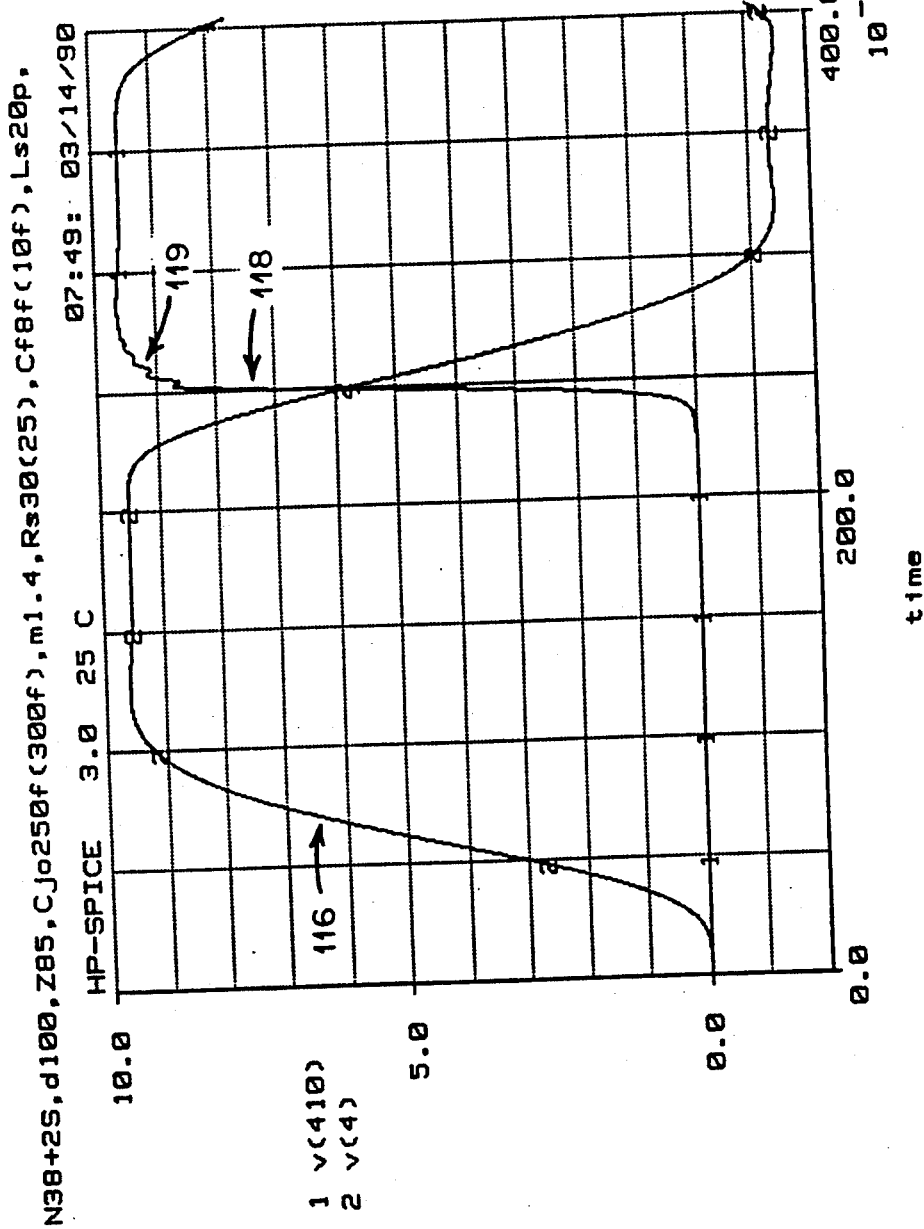
FIG. 11B is a numerical simulation of the nonlinear transmission line shown in FIG. 10.

FIG. 11B shows a numerical (SPICE) simulation of the step response of the 40-cell nonlinear transmission line of FIG. 6 with the last two cells having double-stacked varactor diodes. The last two double-stacked varactor cells are identical and have the following parameters: $Z_u=85\Omega$, $d=100$ μm, $L_u=80$ pH, $C_u=11$ fF, $L_s=20$ pH, and each varactor diode is specified by $C_{jo}=300$ fF, $a=1.4$, $V_b=0.9$ volt, and $R_s=(250$ fF/300 fF$)30\Omega=25\Omega$ ($R_s$ is scaled by the area with which the varactor diode was increased to reach 300 fF) such that $C_{eq}^{stack}=37$ fF and $R_s^{stack}=50\Omega$. These choices result in a stacked-varactor cell impedance $Z_{eq}^{stack}$ equal to the impedance $Z_{eq}$ of the single-varactor cells. The effective cutoff frequency $\omega_r$ of the stacked varactors is now $5.4\times10^{11}$ rad/sec yielding $\omega_{3dB}=0.38\omega_c$. The input step 116 shown in FIG. 11B has a 9.5 volt amplitude and a 10%–90% risetime of 55 ps. The output 118 is a steepened step with an 8.1 ps 10%–90% risetime which represents only a 3.7% decrease in the amount of steepening (48.7 ps for the case of FIG. 11A versus 46.9 ps for the case of FIG. 11B). However, the ringing 119 is significantly reduced to 0.1 volt peak-to-peak.

Accordingly, by utilizing one or more varactor cells within a nonlinear transmission line in which the cutoff frequency $\omega_{3dB}$ is decreased in these cells relative to $\omega_{3dB}$ in the previous cells, excess ringing can be removed without significantly affecting the overall risetime of the sharpened edge. The lower cutoff frequency significantly attenuates the very high frequency harmonics generated in the previous cells which are causing the ringing.

Moreover, in view of Eqn. (11), $\omega_{3dB}$ can also be decreased by decreasing $\omega_r$ and/or $\omega_c$ by adding an extra capacitance $C_{ex}$ in parallel with the varactor diode such that $\omega_r=1/R_s(C_{eq}+C_{ex})$ and $\omega_c=2/\sqrt{L_u(C_{eq}+C_{ex})}$, increasing $L_u$, and/or adding an extra resistance $R_{ex}$ in series with the varactor diode such that $\omega_r=1/(R_{ex}+R_s)C_{eq}$. The first approach is undesirable since capacitors are difficult to fabricate in monolithic integrated circuits. The middle approach increases the length of the nonlinear transmission line and is therefore undesirable. The last alternative requires an additional semiconductor processing step to fabricate $R_{ex}$, but is achievable.

Figure 12:
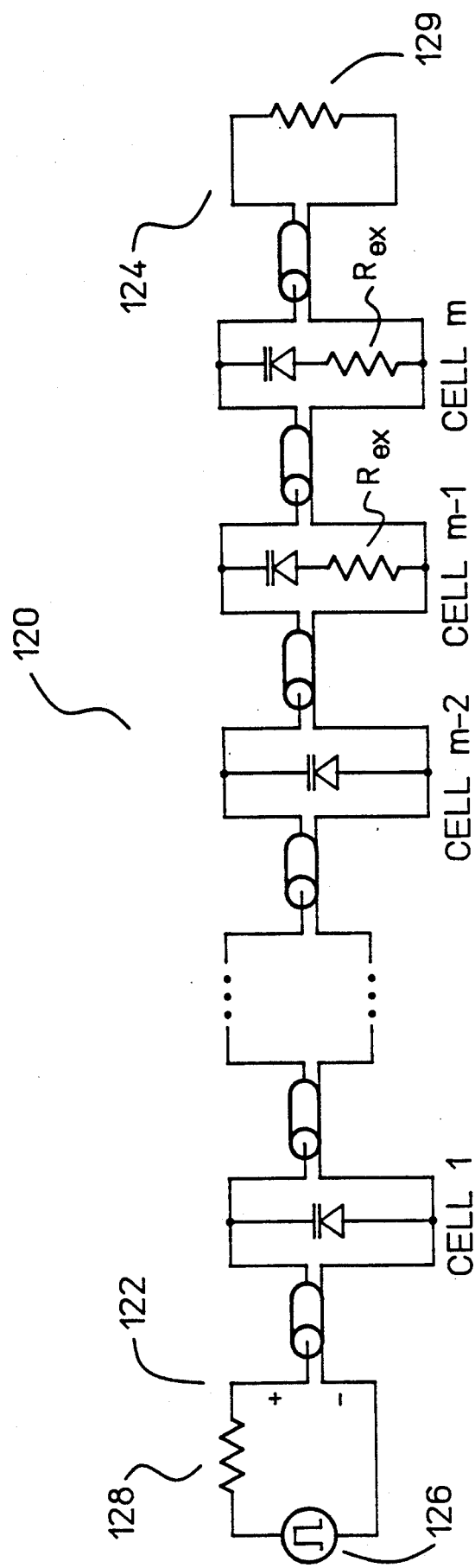
FIG. 12 is a schematic circuit diagram of an alternative embodiment to the nonlinear transmission line in accordance with the invention shown in FIG. 10.
Figure 13:
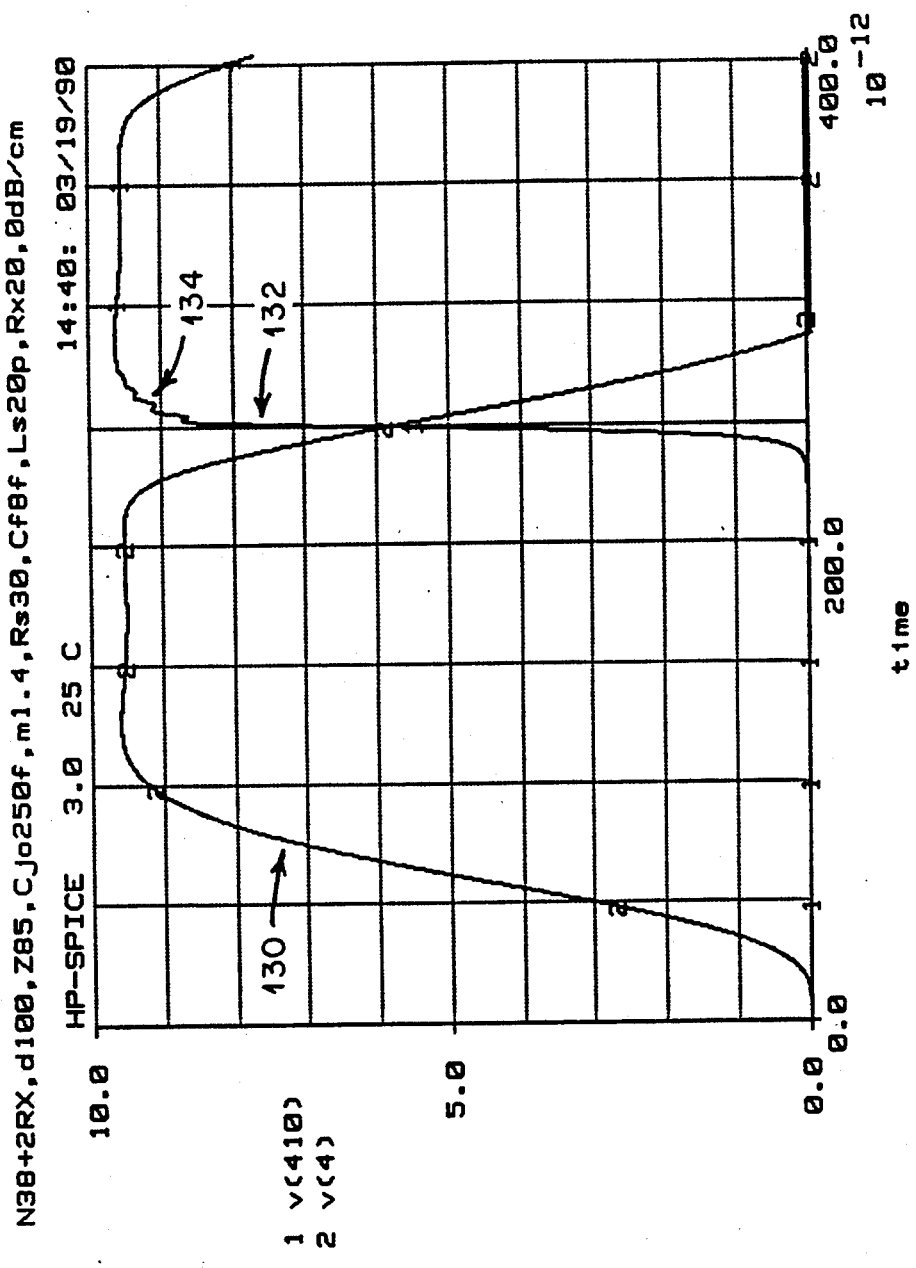
FIG. 13 illustrates a numerical simulation of the alternative nonlinear transmission line shown in FIG. 12.

Accordingly, an alternative embodiment of a "quenching shockline" is shown in FIG. 12. FIG. 12 is similar to FIG. 10 except that the dynamic cutoff frequencies of varactor cells m−1 and m are reduced, not by the utilization of stacked varactor diodes, but by the utilization of the extra resistance $R_{ex}$ in series with a single varactor (FIG. 3D) in the last two varactor cells. FIG. 13 shows a numerical (SPICE) simulation of the step response of the 40-cell nonlinear transmission line 120 shown in FIG. 12 with the last two varactor cells using single varactors in series with the extra resistance $R_{ex}$. The last two varactor cells are identical and have the following parameters: $Z_u=85\Omega$, $d=100$ μm, $L_u=80$ pH, $C_u=11$ fF, $L_s=20$ pH, $C_{jo}=250$ fF, $a=1.4$, $V_b=0.9$ volt, $C_{eq}=37$ fF, $R_s=30\Omega$, and $R_{ex}=20\Omega$. The dynamic cutoff frequency of the varactor-$R_{ex}$ combination is $\omega_r=5.4\times10^{11}$ rad/sec. The input step 130 shown in FIG. 13 has a 9.5 volt amplitude and a 10%–90% risetime of 55 ps. The output 132 is a steepened step with an 8.1 ps 10%–90% risetime, but the ringing 134 is significantly reduced to 0.1 volt peak-to-peak. This is identical to the simulation shown in FIG. 11B, since the cutoff frequencies for both cases are identical.

Accordingly, instead of providing a double-stacked varactor cell as shown in FIG. 3B, which has an increased $R_s$, a varactor cell with a single varactor but with an additional resistance $R_{ex}$ can be utilized, thereby quenching ringing. The disadvantage is that this requires an additional step during semiconductor processing as compared to the utilization of stacked varactor diodes.

In summary, one or more cells of stacked varactors which have reduced cutoff frequencies can be utilized at the output end of a nonlinear transmission line to provide damping of the ringing generated by the preceding cells without significant degradation of the output edge speed. Alternatively, one or more cells of a single varactor in series with an extra resistance can be utilized at the output end of a nonlinear transmission line to provide damping of the ringing generated by the preceding cells without significant degradation of the output edge speed. Additionally, if placed at the input, any high-frequency ringing on the input signal can also be removed.

Although the invention has been described in detail with reference to particular examples of embodiments, persons possessing skill in the art to which this invention pertains will appreciate that various modifications and enhancements can be made without departing from the spirit and scope of the claims that follow. For example, although the various embodiments have been generally described as comprising stacked varactor diodes, a single varactor having parameters equal to the corresponding stacked varactors can be utilized. This, however, would require different varactor diode fabrication processes, which is avoided by varactor diode stacking, but is difficult to achieve practically due to the expense of manufacturing and maintaining a large variety of customized varactor types with differing characteristics. In a monolithically integrated structure, the required individual varactor diode customization is currently not available, since a single epitaxial layer typically fixes a, ($C_{jo}/C_{min}$), and $V_b$ to the same values for all the varactor diodes. However, recent advances in selective epitaxial technologies promise at some time in the future the possibility of monolithically integrating devices such that each device has a specifically tailored characteristic depending on its position within the circuit nonlinear transmission line. Accordingly, insofar as the appended claims are concerned, recitation of noncommensurate varactor cells contemplates either stacked or the equivalent combination of the incorporated stacked varactor diodes.

We claim:

1. A nonlinear transmission line comprising:
   an unloaded transmission line having an input and an output;
   means for injecting at the transmission line input one of a pulse and a step signal having a profile that sufficiently matches the profile of a stable soliton at the input of the transmission line so that substantially only a single soliton is generated by the input signal at the output of the transmission line; and
   a plurality of varactor cells that load the transmission line at a plurality of locations along the transmission line, each varactor cell being contiguous with adjacent varactor cells;
   at least one of the plurality of varactor cells having a voltage-variable capacitance different from a voltage-variable capacitance of at least one other varactor cell, such that the varactor cells of the nonlinear transmission line are noncommensurate, with a first varactor diode means comprising at least one varactor diode in the at least one varactor cell being configured so that the amplitude of the propagating soliton is sufficient to fully deplete the first varactor diode means but is not sufficient to deplete a second varactor diode means comprising at least two stacked varactor diodes in the at least one other varactor cell.

2. A nonlinear transmission line as in claim 1 wherein the varactor diodes are reverse-biased varactor diodes.

3. A nonlinear transmission line as in claim 2 wherein the varactor diodes are hyperabrupt diodes.

4. A nonlinear transmission line as in claim 3 wherein the hyperabrupt diodes have a capacitance $$C_j(V) = \frac{C_{jo}}{\left(1 + \frac{V}{V_b}\right)^a}$$

where $C_{jo}$ is the zero-bias capacitance, V is the voltage which reverse-biases the varactor diode, $V_b$ is the barrier potential of the varactor diode junction, and a is the grading coefficient.

5. A nonlinear transmission line as in claim 1 wherein there are m varactor cells and varactor cells 1 through j are single-varactor cells, j+1 through k are double-stacked varactor cells, varactor cells k+1 through m are triple-stacked varactor cells, the peak amplitude of the soliton when it reaches varactor cell j being sufficient to fully deplete the single varactor diode in cell j, but the peak amplitude of the soliton when it is in the preceding varactor cells being insufficient to fully deplete the varactor diodes in these cells, the peak amplitude of the soliton when it reaches varactor cell k being sufficient to fully deplete the double-stacked varactors in cell k, but the peak amplitude of the soliton when it is in varactor cells j+1 through k−1 being insufficient to fully deplete the double-stacked varactor diodes in these cells, and the peak amplitude of the soliton when it reaches varactor cell m being sufficient to fully deplete the triple-stacked varactors in cell m, but the peak amplitude of the soliton when it is in varactor cells k+1 through m−1 being insufficient to fully deplete the triple-stacked varactor diodes in these cells.

6. A nonlinear transmission line as in claim 5 wherein the varactor diodes are reverse-biased varactor diodes.

7. A nonlinear transmission line as in claim 6 wherein the varactor diodes are hyperabrupt diodes.

8. A nonlinear transmission line as in claim 7 wherein the hyperabrupt diodes have a capacitance $$C_j^{stack} = \frac{C_{jo}}{N\left(1 + \frac{V}{NV_b}\right)^a}$$

for the case where all N varactor diodes are identical, $C_{jo}$ is the zero-bias capacitance, V is the voltage which reverse-biases the varactor diode, $V_b$ is the barrier potential of the varactor diode junction, and a is the grading coefficient.

9. A nonlinear transmission line as in claim 1 wherein the capacitance per varactor cell provided by the varactor diode means in a cell is chosen to be much larger than the capacitance of that cell introduced by the unloaded transmission line so that nonlinear capacitance of these varactor diode means will introduce a significant nonlinearity in the capacitance per cell.

10. A nonlinear transmission line as in claim 4 wherein the varactor diodes dominate the transmission line characteristics and the change in capacitance with voltage is very large, such that $$C_j(V_1) >> C_j(V_2) > C_u$$

where $C_j(V_1)$ is the voltage-variable capacitance at a voltage $V_1$, $C_j(V_2)$ is the voltage-variable capacitance at a voltage $V_2$, and $C_u$ is the capacitance of the transmission line, to achieve a substantial amount of steepening in a relatively short nonlinear transmission line.

11. A nonlinear transmission line as in claim 1 wherein there are m varactor cells and the varactor diode means in cells k+1 through m which precede varactor cell m are used to accommodate the step-up in voltage due to the high impedance at the output, allow the varactor diodes to be sized larger to prevent design rule violations and excessively high series resistance, reduce self-bias effects due to the inverted reflection from a low-impedance load, and absorb a greater portion of the inverted reflection from the low-impedance load, thereby reducing the level of re-reflected energy back to the load.

12. A nonlinear transmission line as in claim 11 wherein the equivalent impedance of the nonlinear transmission line varactor cell is given by $$Z_{eq,k} = \frac{Z_{u,k}}{\sqrt{1 + C_{eq,k}/C_{u,k}}} \sqrt{1 - (\omega/\omega_{c,k})^2}$$

where $Z_{u,k}$ is the impedance of the unloaded transmission line in the $k^{th}$ varactor cell, $C_{eq,k}$ is the equivalent large-signal capacitance of the varactor in the $k^{th}$ varactor cell, $C_{u,k}$ is the capacitance of the transmission line in the $k^{th}$ varactor cell, $\omega$ is the operating frequency, and $\omega_{c,k}$ is the cutoff frequency of the $k^{th}$ varactor cell and wherein $Z_{eq,k}$ of all of the varactor cells is identical and the source and load impedances are equal and resistive and $Z_u$ is made relatively high and $Z_{eq}$ is set by appropriate choices of $C_{eq,k}$ and varactor diode spacing approximately equal to $R_{source} = R_{load} = R$ to maintain good impedance match and efficient power transfer through the nonlinear transmission line.

13. A nonlinear transmission line as in claim 1 wherein the cutoff frequency $\omega_{3dB}$ of at least one varactor cell within the nonlinear transmission line is lower relative to the cutoff frequency $\omega_{3dB}$ in the previous cells, such that excess ringing is removed without significantly affecting the overall risetime of the sharpened edge, the lower cutoff frequency significantly attenuating the very high frequency harmonics generated in the previous cells which are causing the ringing.

14. A nonlinear transmission line as in claim 13 wherein the nonlinear transmission line is constructed of m varactor cells, varactor cells 1 through m−2 being single-varactor cells and varactor cells m−1 and m being double-stacked varactor cells, the stacked varactor diodes in the varactor cells m−1 and m being configured to yield a reduced change in voltage-variable capacitance $C_j(V)$ and larger series resistance $R_s$, resulting in a lower dynamic cutoff frequency $\omega_{3dB}$ in these cells, thereby to significantly attenuate the very high frequency harmonics generated in the previous cells, which cause ringing.

15. A nonlinear transmission line as in claim 13 wherein one or more varactor cells comprising a single varactor diode in series with an extra resistance are utilized at the output end of the nonlinear transmission line to provide damping of ringing generated by preceding varactor cells without significant degradation of the output edge speed.

16. A nonlinear transmission line comprising:
an unloaded transmission line having an input and an output;
means for injecting at the transmission line input one of a pulse and a step signal having a profile that sufficiently matches the profile of a stable soliton at the input of the transmission line so that substantially only a single soliton is generated by the input signal at the output of the transmission line; and
a plurality of varactor cells that load the transmission line at a plurality of locations along the transmission line, each varactor cell being contiguous with adjacent varactor cells;
at least one of the plurality of varactor cells having a voltage-dependent capacitance different from a voltage-dependent capacitance of at least one other varactor cell, such that the varactor cells of the nonlinear transmission line are noncommensurate, with a first varactor diode means in the at least one varactor cell being configured so that the amplitude of the propagating soliton is sufficient to fully deplete the first varactor diode means but is not sufficient to deplete a second varactor diode means in the at least one other varactor cell;
wherein at least one of the varactor cells comprises stacked varactor diodes to yield varactor cells having the noncommensurate voltage-dependent capacitances.

17. A nonlinear transmission line as in claim 16 wherein the cutoff frequency $\omega_{3dB}$ of at least one varactor cell within the nonlinear transmission line is lower relative to the cutoff frequency $\omega_{3dB}$ in the previous cells, such that excess ringing is removed without significantly affecting the overall risetime of the sharpened edge, the lower cutoff frequency significantly attenuating the very high frequency harmonics generated in the previous cells which are causing the ringing.

18. A nonlinear transmission line as in claim 16 wherein the varactor diodes are reverse-biased varactor diodes.

19. A nonlinear transmission line as in claim 18 wherein the varactor diodes are hyperabrupt diodes.

20. A nonlinear transmission line as in claim 19 wherein the hyperabrupt diodes have a capacitance $$C_j(V) = \frac{C_{jo}}{\left(1 + \frac{V}{V_b}\right)^a}$$

where $C_{jo}$ is the zero-bias capacitance, V is the voltage which reverse-biases the varactor diode, $V_b$ is the barrier potential of the varactor diode junction, and a is the grading coefficient.

* * * * *